United States Patent [19]

Winnerl et al.

[11] Patent Number: 4,791,316

[45] Date of Patent: Dec. 13, 1988

[54] LATCH-UP PROTECTION CIRCUIT FOR INTEGRATED CIRCUITS USING COMPLEMENTARY MOS CIRCUIT TECHNOLOGY

[75] Inventors: Josef Winnerl, Landshut; Werner Reczek, Munchen, both of Fed. Rep. of Germany; Wolfgang Pribyl, Villach, Austria

[73] Assignee: Siemens Aktiengesellschaft, Berlin and Munich, Fed. Rep. of Germany

[21] Appl. No.: 25,655

[22] Filed: Mar. 13, 1987

[51] Int. Cl.[4] .............................................. H03K 17/16
[52] U.S. Cl. ............................ 307/296 R; 307/200 B;
307/362; 357/42; 361/86
[58] Field of Search ........................ 307/362-363,
307/ 496-497, 246, 572, 584-585, 296 R, 297;
361/86, 92, 100-101; 357/42, 38, 23.6; 365/226

[56] References Cited

U.S. PATENT DOCUMENTS

| | | | |
|---|---|---|---|
| 4,473,758 | 9/1984 | Huntington | 307/296 R |
| 4,571,505 | 2/1986 | Eaton, Jr. | 307/296 R X |
| 4,670,668 | 6/1987 | Liu | 307/296 R |
| 4,683,488 | 7/1987 | Lee et al. | 357/42 |
| 4,689,653 | 8/1987 | Miyazaki | 357/42 |
| 4,701,777 | 10/1987 | Takayama et al. | 357/42 |

FOREIGN PATENT DOCUMENTS

| | | | |
|---|---|---|---|
| 0012349 | 1/1983 | Japan | 357/42 |
| 0225664 | 12/1983 | Japan | 357/42 |
| 0084864 | 5/1985 | Japan | 357/42 |

OTHER PUBLICATIONS

Halbleiter Elektronik, 14, H. Weiss, K. Horninger, "Integrierte MOS-Schaltungen" pp. 247-248.
Static and Transient Latch-Up Hardness in N-well CMOS with On-Chip Substrate Bias Generator, IEDM 85, "Technical Digest", pp. 504-508.
"CMOS Semiconductor Structure Without Latch-Up and Method of Fabrication", IBM TDB, vol. 27, No. 12, 5-1985, pp. 6968-6970.

Primary Examiner—Stanley D. Miller
Assistant Examiner—D. R. Hudspeth
Attorney, Agent, or Firm—Hill, Van Santen, Steadman & Simpson

[57] ABSTRACT

A latch-up protection circuit for an integrated circuit using complementary MOS circuit technology has a substrate bias generator that applies a negative substrate bias to a semiconductor substrate having a p-conductive material into which a well-shaped semiconductor zone of n-conductive material is inserted. In order to avoid latch-up effects in the integrated circuit, an electronic protection circuit interrupts the capacitive charging currents of a capacitor in the substrate depending on the potential of the semiconductor substrate which is taken at a doped substrate bias terminal. The electronic protection circuit disconnects a capacitor bias generator from the capacitor when a voltage on the substrate bias terminal is greater than a difference between a reference potential and a threshold voltage of a first transistor in the electronic protection circuit. The electronic protection circuit connects the capacitive bias generator to the capacitor when a voltage on the substrate bias terminal is lower than the difference. No quiescent current flows through the electronic protection circuit during normal operation of the integrated circuit.

21 Claims, 2 Drawing Sheets

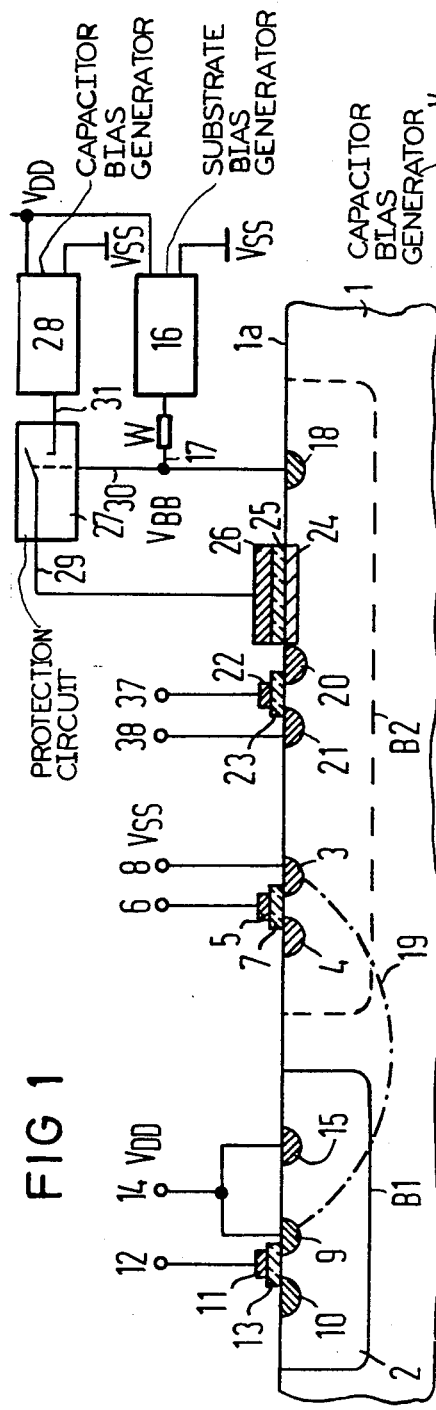
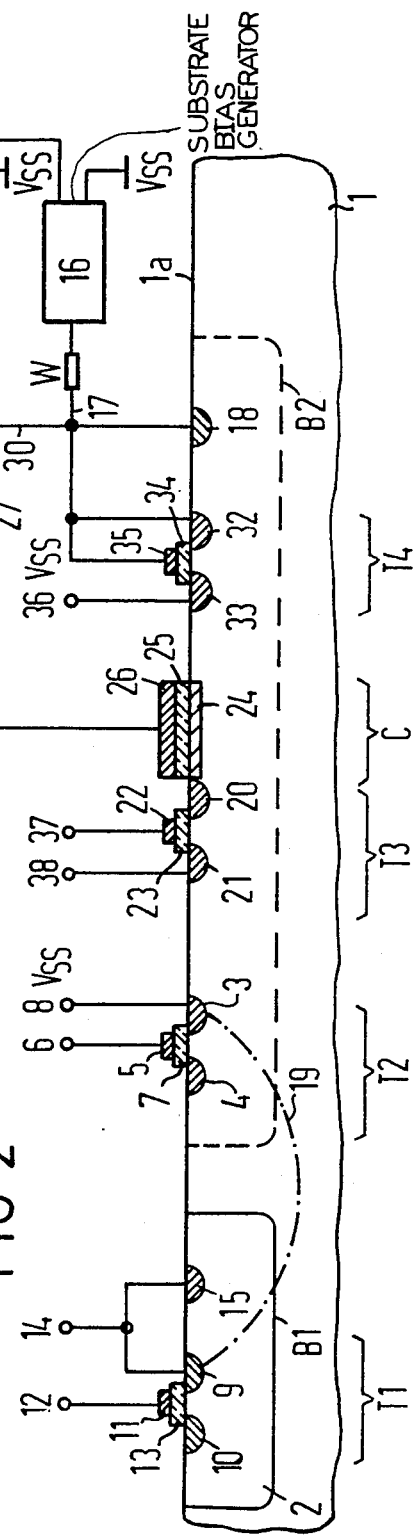
FIG 1
FIG 2

LATCH-UP PROTECTION CIRCUIT FOR INTEGRATED CIRCUITS USING COMPLEMENTARY MOS CIRCUIT TECHNOLOGY

BACKGROUND OF THE INVENTION

This invention relates generally to latch-up protection circuitry for integrated circuits using complementary, MOS circuit technology and, in particular, to latch-up protection circuitry which largely voids occurrence of latch-up effects.

In general, integrated circuits which use complementary MOS technology have a semiconductor substrate which does not lie at the ground potential of the integrated circuit, but is negatively charged by a substrate bias generator. It is known that biasing a semiconductor substrate reduces the transistor and junction capacitances and improves the switching speed of the integrated circuit For example for semiconductor substrate of p-conductive material having inserted therein n-conductive, well-shaped semiconductor zones, the substrate is typically negatively biased in the range −2 to −3 volts. The source regions of field effect transistors that are provided on the semiconductor substrate and which are outside of the wellshaped semiconductor zone are connected to a ground potential, since the semiconductor substrate has a negative bias.

When a positive supply voltage for the integrated circuit is switched on, the p-conductive semiconductor substrate is initially "floating", that is, it is not connected to any external potentials.

This floating condition terminates when the substrate bias generator takes effect. The time span between the turn on of the positive supply voltage and the activation of the substrate bias generator is essentially influenced by such factors as clock frequency, existing coupling capacitances and existing capacitive load. During the time of "floating", the semiconductor substrate can be temporarily charged to a positive bias via the junction capacitances which are present, first between the well-shaped semiconductor zone and the substrate and, second, between the substrate and the source regions of the field effect transistors which are connected to ground potential. This initial positive bias is not removed until the substrate bias generator takes effect, that is, until the negative substrate bias gradually builds up at the output of the substrate bias generator. Even during operation of the integrated circuit, high currents that are shunted by the semiconductor substrate via the substrate bias generator to a terminal of the substrate lying at ground potential can lead to a positive bias of the semiconductor substrate. This is due to a voltage drop at the internal resistance of the substrate bias generator. Positive biases, however, represent a high safety risk for the integrated circuit since a latch-up effect can be triggered thereby disabling the integrated circuit.

For a better understanding of the latch-up effect, it can be assumed that four successive semiconductor layers of alternating conductivity types are generally present between a terminal of a field effect transistor of a first channel type lying in the well-shaped semiconductor zone and a terminal of a field effect transistor of a second channel type located outside of this zone on the semiconductor substrate. The terminal of the former transistor forms the first semiconductor layer, the well-shaped semiconductor zone forms the second, the semiconductor substrate forms the third, and the terminal of the latter transistor forms the fourth semiconductor layer. As a consequence of this structure, a parasitic bipolar pnp transistor and an npn transistor are created. The collector of the pnp transistor corresponds to the base of the npn transistor, and the base of the pnp transistor corresponds to the collector of the npn transistor. This structure forms a four layer pnpn diode, as is typically found in a thyristor. When the semiconductor substrate has a positive bias, the pn junction between the third and fourth semiconductor layers can be biased such that a current flow occurs between the latter transistor terminals, this current path to be attributed to a parasitic thyristor effect within the four layer structure. The current path then continues to exist even after the positive bias is removed from the substrate and this current path can thermally overload the integrated circuit.

For reducing the transistor and junction capacitances, it is known to use a negative substrate bias in NMOS technology, which is generated by a substrate bias generator on the integrated circuit (*Halbleiter Elektronik*, 14, H. Weiss K. Horninger, "Integrierte MOS-Schaltungen", pp. 247-248). The latch-up effect resulting from positive semicohductor substrate biases is also described in this reference on pages 111 through 112. The proposed solution to the latch-up problem presented in this reference is a modification of the doping profiles in the design of the semiconductor wells. Another proposed solution for suppressing the latch-up effect is presented in the publication of D. Takacs et al, "Static and Transient Latch-Up Hardness in n-well CMOS With On-chip Substrate Bias Generator", IEDM 85, Technical Digest, pp. 504–508. This reference discloses a clamping circuit which prevents the latch-up effect in that the semiconductor substrate potential is limited to a value which is not sufficient for activating the parasitic bipolar transistors in the semiconductor substrate. To accomplish this, the clamping circuit shunts the high capacitive displacement currents to ground.

However, the prior art clamping circuit does not fundamentally exclude the possibility of a positive charging of the semiconductor substrate, rather the effects of latch-up are merely compensated in that, should a positive charging of the semiconductor substrate occur, a low impedance connection to ground is utilized to eliminate the positive charging The present invention overcomes these drawbacks in the prior art and in a circuit embodying the present invention the occurrences of latch-up effects are largely avoided.

SUMMARY OF THE INVENTION

The present invention is a novel latch-up protection circuit for use in integrated circuits using complementary MOS circuit technology. The integrated circuit has a substrate bias terminal in a doped semiconductor substrate. The substrate bias terminal is connected to an output of a substrate bias generator. A capacitor has a first surface which is integrated in the doped semiconductor substrate. An electronic protection circuit is connected to and is controlled by a voltage on the substrate bias terminal. The electronic protection circuit is connected to a second surface of the capacitor and has at least one first transistor with a predetermined threshold voltage. A capacitor bias generator provides a predetermined voltage and is connected to the electronic protection circuit. The electronic protection circuit disconnects the capacitor bias generator from the second surface of the capacitor when a voltage on the substrate bias terminal is greater than a difference between a reference potential and the threshold voltage of the first transistor in the electronic protection circuit. Similarly, the electronic protection circuit connects the capacitor bias generator to the second surface of the capacitor when a voltage on the substrate bias terminal is lower than the difference.

The electronic protection circuit has a comparator for comparing the voltage on the substrate bias terminal to the difference defined above. Also, the circuit has an amplifier connected to the comparator which in turn is connected to an electronic switch such that the switch is controlled by the output of the amplifier and connects or disconnects the second surface of the capacitor and the capacitor bias generator.

The present invention has the advantage that the undesirable high charging currents of the semiconductor substrate which can trigger a latch-up effect are eliminated in a straightforward and simple manner.

BRIEF DESCRIPTION OF THE DRAWINGS

Features of the present invention which are believed to be novel as set forth with particularity in the appended claims. The invention, together with further objects and advantages, may best be understood by reference to the following description, taken in conjunction with the accompanying drawings, and the several figures of which like reference numerals identify like elements, and in which:

FIG. 1 is a schematic view depicting an integrated circuit having a one transistor memory cell and using latch-up protection circuitry of the present invention;

FIG. 2 is a schematic illustration of the FIG. 1 integrated circuit with the addition of a clamping circuit;

DESCRIPTION OF THE PREFERRED EMBODIMENT

Figure 3:
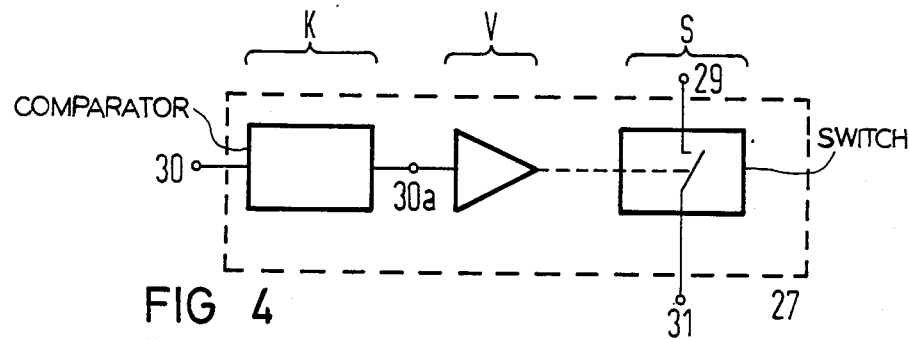
FIG. 3 is a general block diagram of the latch-up protection circuit used in FIGS. 1 and 2.

The present invention has general applicability but is most advantageously used in an integrated circuit of the type shown in FIG. 1. The FIG. 1 integrated circuit utilizes the latch-up protection circuit of the present invention which is constructed on a semiconductor substrate 1 of doped semiconductor material, for example, p-conductive silicon. The semiconductor substrate 1 has an n-conductive, well-shaped semiconductor zone 2 that extends up toward the boundary surface 1a of the semiconductor substrate 1. Also, n+-doped semiconductor regions 3, 4, 20 and 21, which form source and drain regions of two n-channel field effect transistors, T2 and T3, are inserted into the semiconductor substrate at a location outside of the semiconductor zone 2. In this example, a capacitor C may be arbitrarily fashioned, but is shown composed of a planar dielectric layer 25, of a planar polysilicon layer 26 and of a planar, n-doped layer 24. This capacitor C, together with the n-channel field effect transistor T3, form a one transistor memory cell into which information can be written or from which information can be read out. The channel region lying between regions 3 and 4, and similarly between regions 20 and 21, are covered by gates 5 and 22, respectively. Gates 5 and 22 are provided with terminals 6 and 37, respectively, and are separated on the boundary surface 1a by thin, electrically insulating layer 7 and 23, respectively, which may be, for example, $SiO_2$. the drain region 21 is connected to a terminal 38, whereas the source region 3 is connected to a terminal 8 which is at the ground potential $V_{SS}$. Further, p+-doped regions 9 and 10, which are the source and drain regions of a p-channel field effect transistor T1, are inserted into the semiconductor zone 2. The channel region lying between the regions 9 and 10 is covered by a gate 11 which is connected to a terminal 12 and separated from the boundary layer 1a by thin, electrically insulating layer 13, which may also be composed of $SiO_2$. The source region 9 of the field effect transistor T1 is connected to a terminal 14 which in turn is connected to a supply voltage $V_{DD}$. The semiconductor zone 2 lies at the supply voltage $V_{DD}$ via an n+-doped contact region 15 which is connected with the terminal 14.

A substrate bias generator 16 generates a negative substrate bias of, for example, −2 to −3 volts, and is also connected to a reference potential, which is shown as the ground potential $V_{SS}$ in the present embodiment of FIG. 1, and to the supply voltage $V_{DD}$. An output 17 of the substrate bias generator 16 is connected to an input 30 of the latch-up protection circuit 27. Also, the output 17 is connected to a p+-doped substrate voltage terminal 18 that is inserted into the semiconductor substrate 1. Semiconductor substrate 1 is thus at the negative substrate bias $V_{BB}$ generated by the substrate bias generator 16, whereas the source regions, for example, region 3 of the field effect transistor T2, are connected to the ground potential $V_{SS}$. As a result thereof, the junction capacitances of the drain and source regions of the field effect transistors in the semiconductor substrate are reduced. In order to avoid a latch-up effect that might occur along the four layer structure 3, 1, 2 and 9, along the broken line 19 between the terminals 8 and 14, the electronic protection circuit 27 reduces the capacitive charging currents of the capacitor C to values which are insufficient for charging the substrate 1 to such a positive degree that a latch-up effect is triggered. Depending on the voltage level appearing at the input 30 of the electronic protection circuit 27, an input 31 may be electrically connected an output 29 which in turn is connected to capacitor surface 26 of the capacitor C. The input 31 is connected to a capacitor bias generator 28 that is in turn connected to the reference potential $V_{SS}$ and to the supply voltage $V_{DD}$. The output voltage of the capacitor bias generator 28, for example, can amount to half the supply voltage, that is, it may have a value of up to $V_{DD}/2$. The input 30 of the electronic protective circuit 27 is simultaneously connected to the output 17 of the substrate bias generator 16 and to the p+-doped substrate bias terminal 18. Under turn-on conditions of the integrated circuit and where voltages $V_{BB}$ are higher than an internal reference voltage, for example, $V_{SS}$, of the electronic protection circuit 27, the circuit 27 causes an interruption between the input 31 and the output 29. Therefore, when the substrate potential approaches a given positive value, the capacitive charging currents from the capacitor bias generator 28 into the capacitor C are suppressed. For example, this may occur when the voltage supply $V_{DD}$ is switched on and the semiconductor substrate 1 tends to rise to a positive bias due to the capacitive charging currents during the time period before the substrate bias generator 16 reaches its full negative bias level. In normal operations, that is, when the substrate is negatively biased, the capacitor surface 26 is connected to the capacitor bias generator 28 in a low impedance fashion via the electronic protective circuit 27.

FIG. 2 shows a second embodiment of the present invention that differs from FIG. 1 in that an additional clamping circuit is added to the FIG. 1 embodiment. The output 17 of the substrate bias generator 16 is connected in FIG. 2 to a circuit point that lies at the ground potential $V_{SS}$. This is achieved by an electronic switch, field effect transistor T4. In the illustrated embodiment, the circuit point is terminal 36 which is connected to the reference potential $V_{SS}$.

More specifically, the output 17 of the substrate bias generator 16 as shown in FIG. 2 is connected to an n+-doped semiconductor region 32 which is inserted into the semiconductor substrate 1. Another n+-doped semiconductor region 33 in the semiconductor substrate 1 is connected to terminal 36 which is at the ground potential $V_{SS}$. The region of the semiconductor substrate 1 lying between the regions 32 and 33 is covered by a gate 35 that is separated from the boundary surface 1a by a thin, electrically insulating layer 34 composed, for example, of $SiO_2$. Together with the gate structure, 34 and 35, the regions 32 and 33 form the n-channel field effect switching transistor T4.

The input signal for transistor T4 is derived from output 17 which is connected to the gate 35.

The switching transistor T4 in FIG. 2 should have a low threshold voltage which is lower than the forward voltage for the pn junction between regions 1 and 3. This can be achieved in the traditional way, for example, the region of the semiconductor substrate 1 lying between the regions 32 and 33 does not have any doping in addition to the substrate doping which, for example, amounts to $10^{15} cm^{-3}$. The channel regions of the remaining field effect transistors, for example, T2, are provided with an additional doping which intensifies the substrate doping. This may expediently be introduced by way of an implantation with a dose of about $10^{12} cm^{-2}$. When two different insulating layer thicknesses are available in the manufacturing technology employed, then the smaller is expediently used for region 34, for example, approximately 15 nm, whereas a thickness of about 20 through 25 nm is selected for the layer 7 and 13. When the semiconductor substrate 1 is at a positive bias, for example, during the turn-on period of the supply voltage $V_{DD}$ and when the substrate bias generator has not yet reached its full negative voltage level, then the gate 35 is also correspondingly positively biased. This leads to the fact that the switching transistor T4 becomes conductive when the low threshold voltage is exceeded. The voltage at the output 17 of the substrate bias generator 16 is thus limited to the value of the low threshold voltage.

Whereas the electronic protective circuit 27 prevents a positive charging of the semiconductor substrate 1 by interrupting the capacitive charging current of the capacitor C, the additional clamping circuit of transistor T4 operates to prevent all other possibilities of positive substrate charging. This may occur, for example, when high currents derive during operation of the integrated circuit. These high currents may flow to the ground potential $V_{SS}$ via a current path consisting of the semiconductor substrate 1, the terminal 18, the output 17 and the substrate bias generator 16. When this occurs, then a voltage drop can arise at the internal resistor W of the substrate bias generator 16, thus causing the output 17 and therefore the semiconductor substrate 1 to receive, at least temporarily, a positive bias. In this situation, these currents are shunted the additional clamping circuit shown as field effect transistor T4 in FIG. 2.

The substrate bias generator 16, electronic protection circuit 27, and the capacitor bias generator 28 shown in FIGS. 1 and 2 are expediently co-integrated on the semiconductor substrate.

FIG. 3 shows a basic circuit in general block diagram form of the electronic protection circuit 27. As shown, the circuit has three discrete components, a comparator K having an input 30, an amplifier V and an electronic switch S which has an input 31 and an output 29. The comparator K compares the voltage appearing on input 30 with an internally derived voltage value or, for example, to the ground potential $V_{SS}$. When the result of the comparison is positive, a corresponding signal is sent to an output 30a. This signal is amplified by amplifier V and controls electronic switch S. Electronic swtch S connects the input 31 to the output 29 depending upon the results of the comparison made in the comparator K. When the voltage appearing on input 30 is lower than the internal voltage value, the input 31 and the output 29 of the electronic switch S are electrically connected to one another. The amplifier V can be optionally integrated depending on the required matching on the output signal of comparator K to the electronic switch S.

Figure 4:
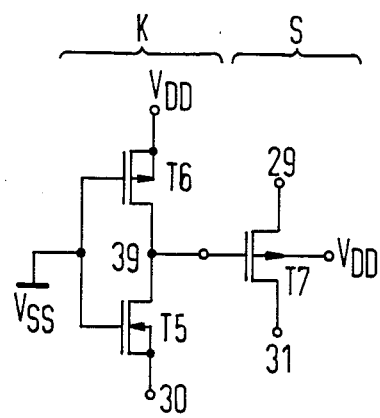
FIG. 4 is a schematic diagram of the FIG. 3 latch-up protection circuit using an ohmic load.

FIG. 4 shows one embodiment of electronic protective circuit 27 having an ohmic load. As shown, it is composed of only two components, a comparator K and an electronic switch S. A series circuit of an n-channel field effect transistor T5 and an ohmic load element forms the comparator K. In the present embodiment, the ohmic load element is formed by a p-channel field effect transistor T6 whose substrate is connected to its source terminal. The gates of the field effect transistors T5 and T6 are interconnected and also connected to the ground potential $V_{SS}$. One terminal (the source of field effect transistor T6) of the series circuit on the ohmic load element side is connected to the supply $V_{DD}$ and the other terminal of the series circuit, that is, the substrate terminal of the field effect transistor T5 are connected to the input 30 of the electronic protection circuit 27. The electronic switch S is formed by a p-channel, field effect transistor T7. Source and drain terminals respectively form the input 31 and the output 29 of electronic protection circuit 27. A circuit point 39 is the connection of the gate of the p-channel field effect transistor T7 to the drains of transistors T5 and T6. The substrate terminal of the field effect transistor T7 is connected to the supply voltage $V_{DD}$.

Whether during turn on or during operation of the integrated circuit, if the voltage at the input 30 exceeds the reference potential VSS less the threshold voltage, UT, of the field effect transistor T5, then the output voltage of the comparator K at the circuit point 39 rises. The field effect transistor T5 becomes non-conductive and the junction 39 has a voltage level equal to the supply voltage $V_{DD}$ through the load element, that is, the p-channel field effect transistor T6. For this reason, the p-channel field effect transistor T7 becomes non-conductive and the connection between the input 31 and the output 29 is interrupted. Given a substrate bias at the input 30, which is lower than the difference ($V_{SS}-UT$), the field effect transistors T5 and T7 becomes conductive, so that the input 31 and the output 29 are electrically connected to one another. A low forward current will flow through the field effect transistors T5 and T6 during operation in accordance with their parameters.

Figure 5:
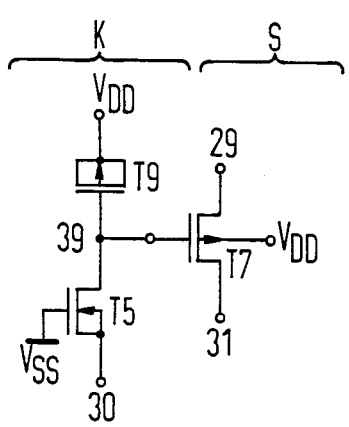
FIGS. 5 and 6 are schematic diagrams of alternative embodiment of the FIG. 3 latch-up protection circuits using capacitive loads.
Figure 6:
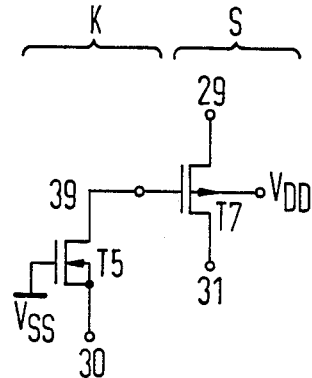

FIGS. 5 and 6 show two alternative embodiments of an electronic protection circuit 27 having a capacitive load. They are similarly composed of two components each, a comparator K and an electronic switch S. As shown in FIG. 5, the capacitive load can be formed by a p-channel field effect transistor T9 connected as a capacitor or, as shown in FIG. 6, can be formed by proper dimensioning of the gate capacitance of the p-channel field effect transistor T7. Electronic protection circuit 27 shown in FIGS. 5 and 6 differ only in the implementation of their capacitive load elements. The p-channel field effect transistor T9 utilized for this purpose in FIG. 5 has its source, drain and substrate terminals connected to the supply votage $V_{DD}$. The field effect transistor T9 may be eliminated as shown in FIG. 6 if the parameters of the field effect transistor T7 are properly established in order to effect the desired gate capacitance.

When the voltage at the input 30 in the FIGS. 5 and 6 embodiments exceeds the voltage $V_{SS}-UT$, then the n-channel field effect transistor T5 becomes non-conductive. The voltage level at the circuit point 39 is substantially equal to the supply voltage $V_{DD}$ via the uncharged capacitor. The field effect transistor T7 becomes non-conductive and interrupts the connection between the input 31 and output 29. When the voltage on the input terminal 30 falls beolow the voltage $V_{SS}-UT$, then the field effect transistor T5 becomes conductive and charges the capacitor. The field effect transistor T7 is likewise placed in a conductive state and the connection between the input 31 and output 29 is established. During normal operation, the capacitor of FIG. 5 and the gate capacitance of FIG. 6 are charged and, therefore, the electronic protection circuits of FIGS. 5 and 6 differ from that shown in FIG. 4 in that they are free of quiescent currents.

Figure 7:
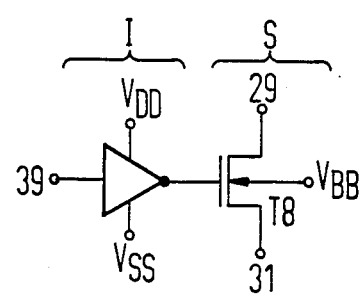
FIG. 7 is a schematic diagram of an implementation of an electronic switch used in the FIG. 3 latch-up protection circuit.

The electronic switches S in FIGS. 4, 5 and 6 were formed exclusively by p-channel field effect transistors. FIG. 7 shows an alternative embodiment in which the electronic switch S is replaced by an n-channel field effect transistor T8. This may be necessary, for example, when an electronic switch having a higher current drive capability is required. To accomplish this, the n-channel field effect transistor T8 is preceeded by an inverter I. The substrate terminal of transistor T8 is connected to the substrate bias $V_{BB}$, which appears on the output 17. Source and drain terminals are connected respectively to the input and output, 31 and 29. The inverter I is connected to the supply voltage $V_{DD}$ and the reference potential VSS An input of the inverter I is connected to the circuit point 39.

In addition to the embodiments described above, the invention also envisions embodiments wherein an n-conductive substrate is provided with p-conductive, well-shaped semiconductor zones. The conductivity types of all silicone parts and the polarities of all voltages are replaced by their respective opposite counterparts.

Furthermore, embodiments derived from those shown in FIGS. 1 and 2 may be envisioned having the following modifications. The boundary line B1 may be omitted and the substrate 1 and the zone 2, may be considered to both be an nconductive substrate. Therefore, a p-conductive, well-shaped, semiconductor zone must then be inserted into this n-conductive substrate. This p-conductive zone is separated from the n-conductive substrate by the broken line B2 and contains the circuit elements T2, T3, C, T4 and terminal 18.

A preferred application of the present invention is utilized in circuits of dynamic semiconductor memories having high packing density. These periphery circuits are monolithically integrated with the memory cells.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

We claim:

1. A latch-up protection circuit for use in integrated circuits using complementary MOS circuit technology, the integrated circuit having a substrate bias terminal and a doped semiconductor substrate, the substrate biased terminal connected to an output of a substrate bias generator, comprising:
    a capacitor having first and second capacitor surfaces, said first surface integrated in the semiconductor substrate;
    an electronic protection circuit connected to the substrate biased terminal and controlled by a voltage thereon, said electronic protection circuit also connected to said second surface of said capacitor, said electronic protection circuit having at least a first transistor with a predetermined threshold voltage; and
    a capacitor bias generator for providing a predetermined voltage connected to said electronic protection circuit, said electronic protection circuit disconnecting said capacitor bias generator from said second surface of said capacitor when a voltage on the substrate bias terminal is greater than a difference between a reference potential and said threshold voltage of said first transistor in said electronic protection circuit, and said electronic protection circuit connecting said capacitor bias generator to said second surface of said capacitor when a voltage on the substrate bias terminal is less than said difference.

2. The latch-up protection circuit described in claim 1, wherein the semiconductor substrate has at least a well-shaped semiconductor zone of a first conductivity type, the semiconductor substrate having a second conductivity type, said well-shaped semiconductor zone of said first conductivity type inserted into said semiconductor substrate of said second conductivity type, the substrate bias terminal and said first surface of said capacitor located in said well-shaped semiconductor zone.

3. The latch-up protection circuit described in claim 1, wherein said electronic protection circuit comprises:
    means for comparing said voltage on the substrate bias terminal to said difference between said reference potential and said threshold voltage of said first transistor;

means for amplifying having an input connected to an output of said means for comparing; and means for electronic switching having an input connected to an output of the means for amplifying and also connected to said second surface of said capacitor and to said capacitor bias generator.

4. The latch-up protection circuit described in claim 3, wherein said means for comparing comprises:

a first input connected to the substrate bias terminal;

a second input connected to said reference potential;

a load element having a first terminal connected to a predetermined positive supply voltage; and said first field effect transistor having a first terminal and a substrate terminal connected to said first input, a gate terminal connected to said second input and a second terminal connected to a second terminal of said load element, said load element and said first field effect transistor thereby being in series.

5. The latch-up protection circuit described in claim 4, wherein said means for electronic switching comprises p-channel field effect transistor having a gate connected to said second terminal of said load element, a substrate terminal connected to said positive supply voltage, a drain connected to said second surface of said capacitor and a source connected to said capacitor bias generator.

6. A latch-up protection circuit described in claim 5, wherein said load element is the gate capacitance of said p-channel field effect transistor.

7. The latch-up protection circuit described in claim 4, wherein said means for electronic switching comprises:

an inverter having an input connected to said second terminal of said load element and having an output; and an n-channel field effect transistor having a gate connected to said output of said inverter, a substrate terminal connected to the output of the substrate bias generator, a source connected to said second surface of said capacitor and a drain connected to said capacitor bias generator.

8. The latch-up protection circuit described in claim 4, wherein said load element comprises a second field effect transistor having a channel type different from a channel type of said first field effect transistor, and having a gate connected to said gate of said first field effect transistor, a first terminal and a substrate terminal connected to said positive supply voltage and a second terminal connected to said second terminal of said first field effect transistor.

9. The latch-up protection circuit described in claim 4, wherein said load element is a capacitor.

10. The latch-up protection circuit described in claim 9, wherein said capacitor is a third field effect transistor having a different channel type from a channel type of said first field effect transistor, and having a source, a drain and a substrate terminal connected to said positive supply voltage, and having a gate connected to said gate of said first field effect transistor.

11. The latch-up protection circuit described in claim 1, wherein said latch-up protection circuit further comprises second means for providing an electronic switch controlled by voltage on the substrate bias terminal and having an input also connected to the substrate bias terminal and an output connected to said reference potential.

12. The latch-up protection circuit described in claim 11, wherein the substrate bias generator, said capacitor bias generator, said electronic protection circuit and said second means for providing an electronic switch are co-integrated on the semiconductor substrate.

13. A latch-up protection circuit for use in integrated circuits using complementary MOS circuit technology, the integrated circuit having a substrate bias terminal in a doped semiconductor substrate, the substrate bias terminal connected to an output of a substrate bias generator, comprising:

a capacitor having first and second capacitor surfaces, said first surface integrated in the semiconductor substrate;

an electronic protection circuit having a first input connected to the substrate bias terminal and a second input connected to a reference potential, having a load element with a first terminal connected to a predetermined positive supply voltage, having at least a first field effect transistor with a first terminal and a substrate terminal connected to said first input, a gate terminal connected to said second input and a second terminal connected to a second terminal of said load element, said load element and said first field effect transistor thereby being in series, and having a p-channel field effect transistor with a gate connected to said second terminal of said load element, a substrate terminal connected to said positive supply voltage, a drain connected to said second surface of said capacitor and a source terminal, said first field effect transistor having a predetermined threshold voltage; and a capacitor bias generator for providing a predetermined voltage connected to said source terminal of said p-channel field effect transistor in said electronic protection circuit, said electronic protection circuit disconnecting said capacitor bias generator from said second surface of said capacitor when a voltage on the substrate bias terminal is greater than a difference between said reference potential and said threshold voltage of said first field effect transistor, and said electronic protection circuit connecting said capacitor bias generator to said second surface of said capacitor when the voltage on the substrate bias terminal is less than said difference.

14. The latch-up protection circuit described in claim 13, wherein said load element comprises a second field effect transistor having a channel type different from a channel type of said first field effect transistor, and having a gate connected to said gate of said first field effect transistor, a first terminal and a substrate terminal connected to said positive supply voltage and a second terminal connected to said second terminal of said first field effect transistor.

15. The latch-up protection circuit described in claim 13, wherein said load element is a third field effect transistor having a channel type different from a channel type of said first field effect transistor, and having a source, a drain, and a substrate terminal connected to said positive supply voltage, and having a gate connected to said gate of said first field effect transistor.

16. The latch-up protection circuit described in claim 13, wherein said load element is the gate capacitance of said p-channel field effect transistor.

17. The latch-up protection circuit described in claim 13, wherein said latch-up protection circuit further comprises a second means for providing an electronic switch controlled by the voltage on the substrate bias terminal and having an input also connected to the substrate bias terminal and an output connected to said reference potential.

18. A latch-up protection circuit for use in integrated circuits using complementary MOS circuit technology, the integrated circuit having a substrate bias terminal in a doped semiconductor substrate, the substrate bias terminal connected to an output of a substrate bias generator, comprising:

a capacitor having first and second capacitor surfaces, said first surface integrated in the doped semiconductor substrate;

an electronic protection circuit having a first input connected to the substrate bias terminal and a second input connected to a reference potential, having a load element with a first terminal connected to a predetermined positive supply voltage, having at least a first field effect transistor with a first terminal and a substrate terminal connected to said first input, a gate terminal connected to said second input, and a second terminal connected to a second terminal of said load element, said load element and said first field effect transistor thereby being in series and said first field effect transistor having a predetermined threshold voltage;

an inverter having an input connected to said second terminal of said load element and having an output;

an n-channel field effect transistor having a gate connected to said output of said inverter, a substrate terminal connected to the output of the substrate bias generator, a source connected to said second surface of said capacitor and a drain; and a capacitor bias generator for providing a predetermined voltage connected to said drain of said n-channel field effect transistor in said electronic protection circuit, said electronic protection circuit disconnecting said capacitor bias generator from said second surface of said capacitor when a voltage on the substrate bias terminal is greater than a difference between said reference potential and said threshold voltage of said first field effect transistor, and said electronic protection circuit connecting said capacitor bias generator to said second surface of said capacitor when a voltage on the substrate bias terminal is lower than said difference.

19. The latch-up protection circuit described in claim 18, wherein said load element comprises a second field effect transistor having a channel type different from a channel type of said first field effect transistor, and having a gate connected to said gate of said first field effect transistor, a first terminal and a substrate terminal connected to said positive supply voltage and a second terminal connected to said second terminal of said first field effect transistor.

20. The latch-up protection circuit described in claim 18, wherein said load element is a third field effect transistor having a channel type different from a channel type of said first field effect transistor, and having a source, a drain and a substrate terminal connected to said positive supply voltage, and having a gate connected to said gate of said first field effect transistor.

21. The latch-up protection circuit described in claim 18, wherein said latch-up protection circuit further comprises second means for providing an electronic switch controlled by the voltage on the substrate bias terminal and having an input also connected to the substrate bias terminal and an output connected to said reference potential.

* * * * *